United States Patent
Nakanishi

(10) Patent No.: US 11,284,548 B2
(45) Date of Patent: Mar. 22, 2022

(54) DISPLAY DEVICE

(71) Applicant: Japan Display Inc., Tokyo (JP)

(72) Inventor: Takayuki Nakanishi, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 17/002,938

(22) Filed: Aug. 26, 2020

(65) Prior Publication Data
US 2020/0387251 A1    Dec. 10, 2020

Related U.S. Application Data

(63) Continuation of application No. 16/281,465, filed on Feb. 21, 2019, now Pat. No. 10,795,520, which is a
(Continued)

(30) Foreign Application Priority Data

Jun. 30, 2016    (JP) .................. 2016-130332

(51) Int. Cl.
*G06F 3/041*    (2006.01)
*G06F 3/044*    (2006.01)
(Continued)

(52) U.S. Cl.
CPC ..... *H05K 9/0084* (2013.01); *G02F 1/133385* (2013.01); *G06F 3/044* (2013.01); *G06F 3/0412* (2013.01); *G06F 3/0416* (2013.01); *G06F 3/0443* (2019.05); *G06F 3/0446* (2019.05); *G06F 3/04166* (2019.05); *H05K 9/0096* (2013.01); *G02F 1/13338* (2013.01); *G06F 2203/04102* (2013.01); *G06F 2203/04103* (2013.01); *G06F 2203/04106* (2013.01);
(Continued)

(58) Field of Classification Search
CPC .... G02F 1/133305; G06F 1/1652; G06F 3/03; G06F 3/013; G06F 3/041; G06F 3/0412; G06F 3/0416; G06F 3/044; G06F 3/0482; G06F 2203/04102; G06F 2203/04107; H01L 27/323
See application file for complete search history.

(56) References Cited

U.S. PATENT DOCUMENTS

| | | | |
|---|---|---|---|
| 2015/0331508 A1* | 11/2015 | Nho | G06F 3/0445 345/173 |
| 2016/0282990 A1* | 9/2016 | Kimura | G06F 3/04166 |
| 2016/0372083 A1* | 12/2016 | Taite | G06F 1/1652 |

* cited by examiner

*Primary Examiner* — Michael J Eurice
(74) *Attorney, Agent, or Firm* — Michael Best & Friedrich LLP

(57) ABSTRACT

A display device with an input function is provided with a display panel, a touch sensor arranged overlapping the display panel, and an electromagnetic shield arranged overlapping the display panel, the display panel, the touch sensor, and the electromagnetic shield have flexibility, the display panel includes a substrate having flexibility, a functional circuit layer arranged on the first surface of the substrate, and a display element layer provided in a location facing the first surface via the functional circuit layer, the touch sensor includes a plurality of electrostatic capacitance type sensor electrodes arranged in a location facing the functional circuit layer via the display element layer, the electromagnetic shield is arranged in a location further outside than the touch sensor from the rolled axis or the folded axis of the substrate when the functional circuit layer and the display element layer are rolled or folded inward.

18 Claims, 14 Drawing Sheets

Related U.S. Application Data continuation of application No. 15/626,249, filed on Jun. 19, 2017, now Pat. No. 10,254,907.

(51) Int. Cl.
  *H05K 9/00* (2006.01)
  *G02F 1/1333* (2006.01)
(52) U.S. Cl.
  CPC .............. *G06F 2203/04107* (2013.01); *G06F 2203/04112* (2013.01)

DISPLAY DEVICE

CROSS-REFERENCE TO RELATED APPLICATIONS

This application is a continuation of U.S. patent application Ser. No. 16/281,465, filed on Feb. 21, 2019, which, in turn, is a continuation of U.S. patent application Ser. No. 15/626,249 (now U.S. Pat. No. 10,254,907), filed on Jun. 19, 2017. Further, this application is based upon and claims the benefit of priority from the prior Japanese Patent Application No. 2016-130332, filed on Jun. 30, 2016, the entire contents of which are incorporated herein by reference.

FIELD

The present invention relates to a display device. The embodiments of the invention disclosed in the present specification relate to a display device with an input function having flexibility.

BACKGROUND

Electronic devices such as tablet terminals and multiple function mobile phones called smartphones, and the like operated by touching (touching with fingertips, etc.) images such as icons displayed on a screen are widely used. Such electronic devices are provided with a display screen formed of a display panel for displaying images, and a touch sensor overlapping this display screen.

Liquid crystal display panels and organic electroluminescence display panels are used as display panels used in such electronic devices. Electrostatic capacitance type touch sensors are mainly used as touch sensors provided overlapping the display panel. Electrostatic capacitance type touch sensors electrically detect changes in electrostatic capacitance by touch or by proximity of the body (fingertips, etc.) and determine whether or not there is a touch. A display device having an input function provided with a pixel region in which an organic light-emitting diode is formed above a substrate, and touch sensor electrodes provided above this pixel region, for example, is disclosed as a display device in which an electrostatic capacitance type touch sensor is added (for example, in U.S. Patent Application Publication 2015/0311477).

New uses for display panels such as liquid crystal display panels and organic electroluminescence display panels are being studied. For example, since it is possible to roll and fold display screens in display devices having flexibility, it is expected that an electronic device with an unconventional form can be provided. In display devices having flexibility, touch sensors are provided above the display surface so it is possible to realize display devices having input functions. However, since conventional touch sensors perform touch detection of plate-like display surfaces, touch input may be performed normally when a touch sensor is built into a display device having flexibility and spread out in a planar shape, but in a state in which a portion of the display screen is rolled and folded, there is a likelihood that touch detection will become unstable.

SUMMARY

A display device with an input function according to an embodiment of the present invention is provided with a display panel, a touch sensor arranged overlapping the display panel, and an electromagnetic shield arranged overlapping the display panel, the display panel, the touch sensor, and the electromagnetic shield have flexibility, the display panel includes a substrate having flexibility, a functional circuit layer arranged on the first surface of the substrate, and a display element layer provided in a location facing the first surface via the functional circuit layer, the touch sensor includes a plurality of electrostatic capacitance type sensor electrodes arranged in a location facing the functional circuit layer via the display element layer, the electromagnetic shield is arranged in a location further outside than the touch sensor from the rolled axis or the folded axis of the substrate when the functional circuit layer and the display element layer are rolled or folded inward.

A display device with an input function according to an embodiment of the present invention has a display panel, a touch sensor arranged overlapping the display panel and an electromagnetic shield arranged overlapping the display panel, and a control circuit connected to the touch sensor having flexibility, the touch sensor and the electromagnetic shield are arranged so it is possible to be rolled in at least one direction with the display panel, the display panel includes a pixel region in which a plurality of pixels are arranged, the touch sensor includes a plurality of electrostatic capacitance type sensor electrodes in a region overlapping at least the pixel region, and the control circuit includes a rolled state determination circuit for detecting the rolled state of the display panel.

DESCRIPTION OF EMBODIMENTS

Hereinafter, the embodiments of the present invention will be described while referencing the drawings. However, the present invention may be implemented in many different ways, therefore interpretation should not be limited to the content exemplified in the embodiments below. In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols (numbers followed by a, b, and the like) and detailed descriptions are omitted accordingly. Furthermore, characters labeled as "first" and "second" are symbols used to distinguish each element, and do not have any further meaning unless otherwise specified.

In this specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a cross-sectional view, the side on which the second substrate is located with respect to the substrate will be described as "above" and the other side will be described as "below."

First Embodiment

Figure 1:
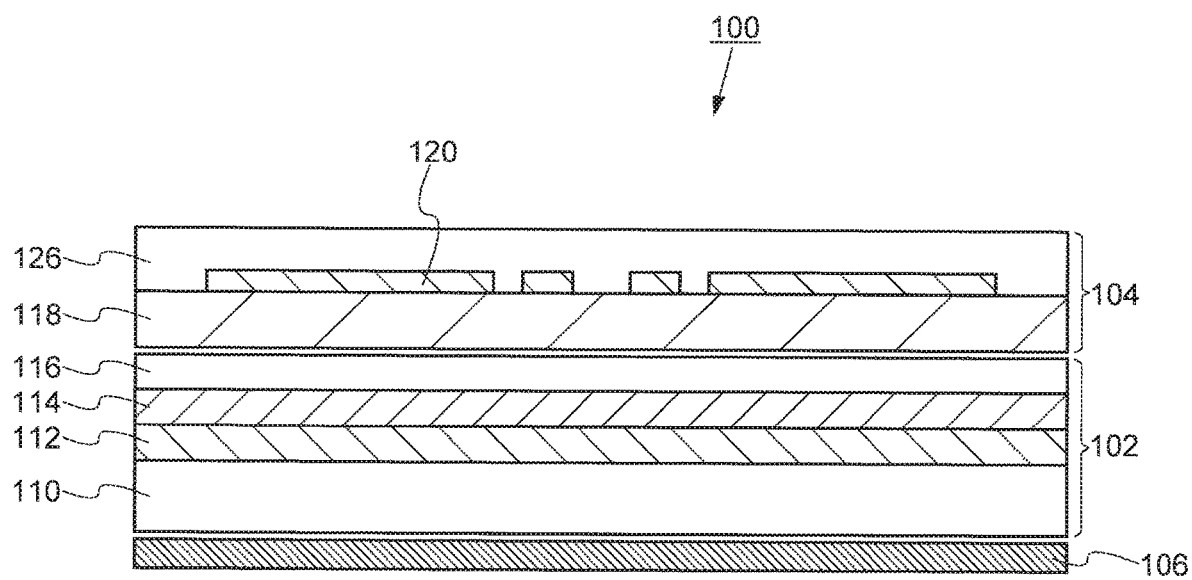
FIG. 1 is a cross-sectional view showing the structure of the display device with an input function according to an embodiment of the present invention.

FIG. 1 shows the structure of the display device with an input function 100 according to an embodiment of the present invention in a cross-sectional view. The display device with an input function 100 includes a display panel 102, a touch sensor 104, and an electromagnetic shield 106. FIG. 1 shows a structure in which the touch sensor 104 is arranged on one side of the display panel 102, and the electromagnetic shield 106 is arranged on the other side. The display panel 102 is configured using a substrate 110 having flexibility, so it is possible to roll and fold the display screen. Further, the touch sensor 104 and the electromagnetic shield 106 also have flexibility, so it is possible to roll and fold them with the display panel 102. Although FIG. 1 shows that the touch sensor 104 and the electromagnetic shield 106 are arranged with a small gap with respect to the display panel 102, the display device with an input function 100 according to the present embodiment is not limited to this form, and each structure part may be closely arranged, and components such as adhesives may be interposed therebetween.

In the display panel 102, a display element layer 114 is arranged on the first surface of the substrate 110. A functional circuit layer 112 is arranged between the substrate 110 and the display element layer 114. In other words, a functional circuit layer 112 is arranged on the first surface of the substrate 110, and the display element layer 114 is provided in a location facing the first surface via the functional circuit layer 112. The display element layer 114 includes display elements. The functional circuit layer 112 includes active elements such as transistors and passive elements such as capacitors, and is a layer in which a circuit for displaying images is formed. In the display panel 102, the display screen is formed by display elements included in the display element layer 114 and a functional circuit formed in the functional circuit layer 112. The display panel 102 in the present embodiment has a structure in which the display screen is visible from the side on which the display element layer 114 is arranged. Further, a protection layer 116 may be arranged above the display element layer 114 (the surface opposite to the substrate 110). The protection layer 116 is formed of insulating materials having light transmissivity in at least one layer.

Liquid crystal elements and light-emitting elements may be provided as display elements provided in the display element layer 114. In the present embodiment, light-emitting elements shall be used as display elements. Organic electroluminescence elements (hereinafter "organic EL elements") using organic electroluminescence materials (hereinafter "organic EL materials") as light-emitting materials, for example, may be applied as light-emitting elements. The organic EL elements have a structure provided with an organic layer including organic EL materials between a first electrode (also called an anode) and a second electrode (also called a cathode). The display element layer 114 includes a first electrode, an organic layer, and a second electrode forming organic EL elements as a layer structure.

The touch sensor 104 includes a plurality of sensor electrodes 120 arranged on the first surface of the substrate 118 (the surface opposite to the display element layer 114). That is to say, the touch sensor 104 includes a plurality of sensor electrodes 120 arranged in locations facing the functional circuit layer 112 via the display element layer 114. The touch sensor 104 is an electrostatic capacitance type touch sensor, and the plurality of sensor electrodes 120 are arranged so as to form electrostatic capacitance. The plurality of sensor electrodes 120 are arranged in a region overlapping the display element layer 114 and the functional circuit layer 112. That is to say, the plurality of sensor electrodes 120 are arranged above the display screen (the surface of the side of the viewer) formed by the display element layer 114 and the functional circuit layer 112. Because of this, the substrate 118 and the plurality of sensor electrodes 120 preferably have transparency. For example, the plurality of sensor electrodes 120 are preferably formed of a transparent conductive film, and as another form may be formed by a metallic thin line pattern.

The electromagnetic shield 106 is arranged in a location not blocking the display screen formed of the display element layer 114 and the functional circuit layer 112 with respect to the display panel 102. The electromagnetic shield 106 is arranged in a location not blocking the touch surface 128 (in FIG. 1, the surface or above the surface of the protection layer) in a state in which at least the display panel 102 and the touch sensor 104 are spread out in a planar shape. FIG. 1 shows a situation in which the electromagnetic shield is arranged on the surface opposite to the surface on the side on which the touch sensor 104 is arranged with respect to the display panel 102.

Components such as sheets, plates, or foils formed of conductive materials are applicable for the electromagnetic shield 106. The electromagnetic shield 106 is arranged so as to cover substantially one side of the display panel 102. In other words, the electromagnetic shield is arranged so as to cover at least one side of the functional circuit layer 112 provided on the display panel 102. The electromagnetic shield 106 has a function for preventing the electromagnetic noise generated from the functional circuit layer 112 from radiating by maintaining a predetermined potential (a constant potential or a potential fluctuating by a predetermined amplitude). The electromagnetic shield 106 is not affect the operation of the touch sensor in a state in which at least the display panel 102 is spread out in a planar shape by being arranged below (the substrate 110 side) the functional circuit layer 112.

In the present embodiment, the display device with an input function 100 has flexibility. The substrate 110 of the display panel 102 and the substrate 118 of the touch sensor 104 are formed of resin materials. For example, these substrates are formed by polyimide. In this way, the display device with an input function 100 has flexibility.

Figure 2A:
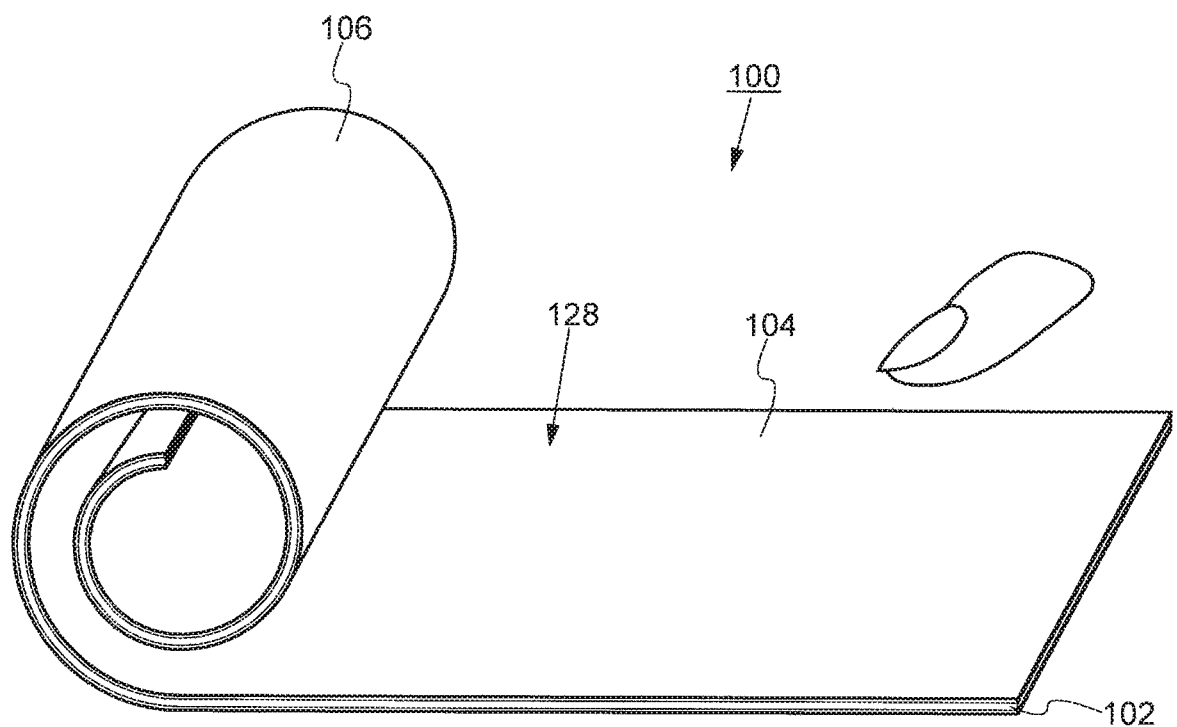
FIG. 2A is a perspective view showing the rolled state of the display screen of the display device with an input function according to an embodiment of the present invention.
Figure 2B:
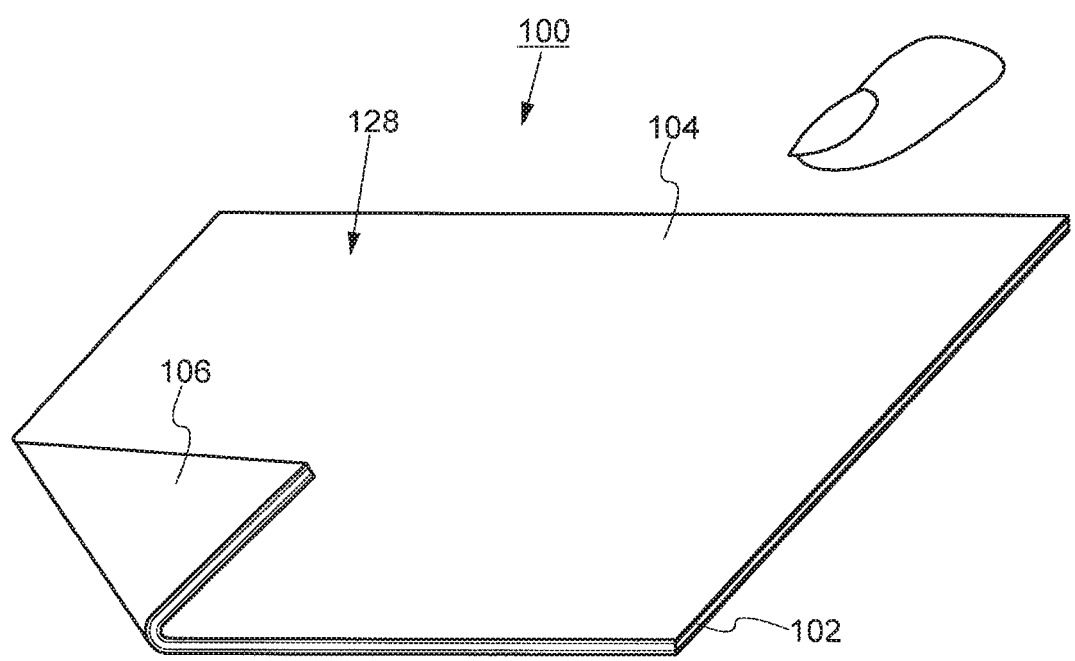
FIG. 2B is a perspective view showing the folded state of the display screen of the display device with an input function according to an embodiment of the present invention.

In a state in which a portion of the display device with an input function 100 is rolled as is shown in FIG. 2A, and a state in which a portion of the display device with an input function 100 is folded as is shown in FIG. 2B, the reverse surface of the display panel 102 appears above the touch surface 128. That is to say, the reverse surface of the display panel 102 overlaps the touch surface of the touch sensor 104. In this state, when there is no electromagnetic shield to shield the electromagnetic noise generated in the functional circuit layer 112, the electromagnetic noise generated in the functional circuit layer 112 influences the operation of the touch sensor 104 and leads to malfunctions and reduced sensitivity. A drive circuit outputting scanning signals and image signals and a pixel circuit controlling the display elements are included as a functional circuit formed in the functional circuit layer 112 when the display panel 102 displays an image. The drive circuit performs operations outputting scanning signals and image signals to the pixel circuit. The pixels included in the pixel region are selected by the scanning signal, and the image signal is written at a rate of once per frame period (for example, 1/60 seconds). Electromagnetic noise is generated along with the operations of the functional circuit.

In the present embodiment, the electromagnetic shield 106 is provided on one side of the display panel 102. The electromagnetic shield 106 shields electromagnetic noise generated in the functional circuit layer 112. As is shown in FIG. 2A and FIG. 2B, even if the reverse surface of the display panel appears on the touch surface 128, electromagnetic noise from the functional circuit layer 112 is shielded by the electromagnetic shield 106. That is to say, the electromagnetic shield 106 is arranged in a location further outside than the touch sensor 104 when looking from the rolled axis or the folded axis (rolled center or folded center (line)) when the functional circuit layer 112 and the display element layer 114 of the display panel 102 are rolled or folded inward. In this way, even if the display screen of the display device with an input function 100 is rolled or folded, it is possible for the touch sensor 104 to operate normally without being influenced by the electromagnetic noise from the functional circuit 112.

Figure 3:
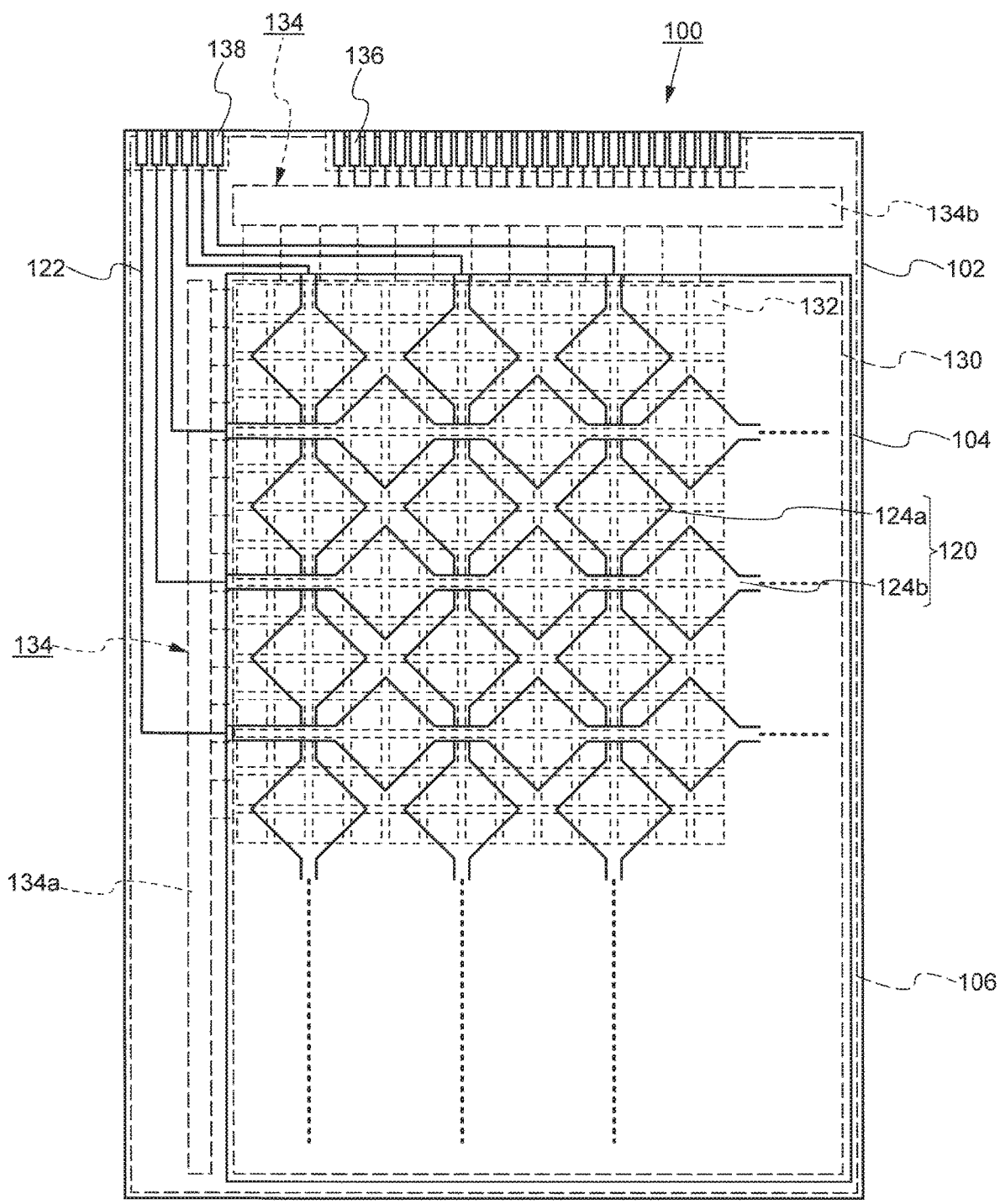
FIG. 3 is a plan view showing the structure of the display device with an input function according to an embodiment of the present invention.

FIG. 3 shows the structure of the display device with an input function 100 according to the present embodiment in a plan view. The display device with an input function 100 includes a display panel 102, a touch sensor 104, and an electromagnetic shield 106. The display panel 102 includes a pixel part 130 in which a plurality of pixels 132 are arranged, and a drive circuit 134 for outputting signals to the pixel part 130. The drive circuit 134 is arranged in an exterior region of the pixel part 130. The pixel part 130 forms a display screen. The drive circuit 134 includes either one of or both a first drive circuit 134a for outputting scanning signals and a second drive circuit 134b for outputting image signals. First terminal parts 136 into which image signals are input are arranged in the exterior region of the drive circuit 134.

The touch sensor 104 shown in FIG. 3 includes a plurality of sensor electrodes 120. A plurality of transmitter electrodes 124a (Tx electrode) and a plurality of receiver electrodes 124b (Rx electrodes) are arranged as the sensor electrodes 120 in the touch sensor 104 shown in FIG. 3. The plurality of sensor electrodes 120 are arranged overlapping the pixel part 130. Each of the plurality of sensor electrodes 120 are connected to second terminal parts 138 by wirings 122. The signals detected by the sensor electrodes 120 are output from the second terminal parts 138. In the present embodiment, the touch sensor 104 is an electrostatic capacitance type touch sensor. The electrostatic capacitance type touch sensor is further classified as a self-capacitance type and mutual capacitance type touch sensor. The sensor electrodes 120 are arranged in a formation corresponding to these types.

Figure 4A:
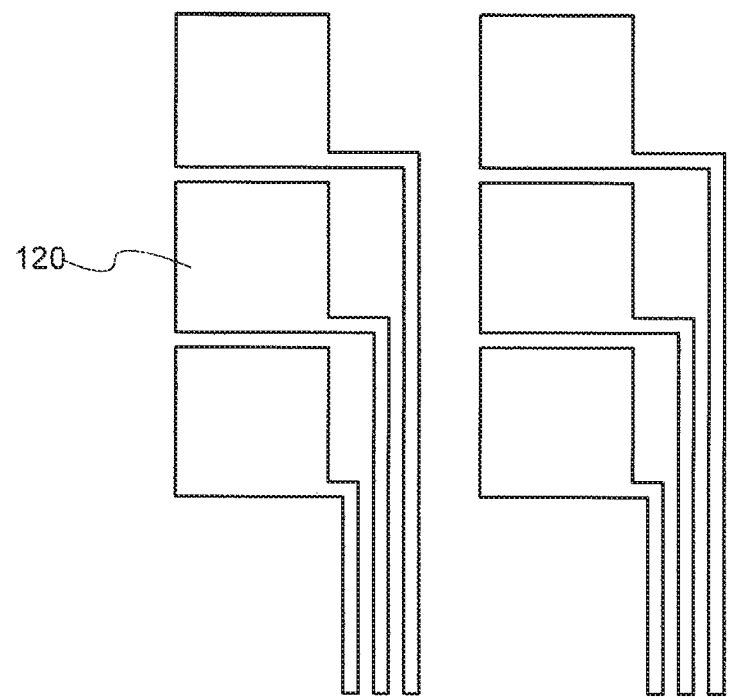
FIG. 4A and FIG. 4B are diagrams showing the structure of a sensor electrode provided in the display device with an input function according to an embodiment of the present invention.
Figure 4B:
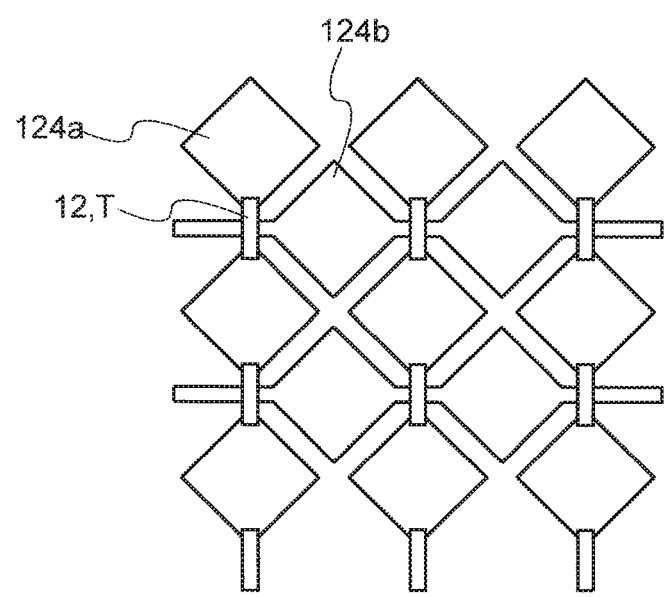

FIG. 4A and FIG. 4B show examples of the sensor electrodes. FIG. 4A shows a pattern of sensor electrodes 120 according to a self-capacitance type. Self-capacitance type sensor electrodes 120, for example, are formed in a rectangular shape. Wirings for providing signals are connected from each of the sensor electrodes 120. In a self-capacitance type, the electrostatic capacitance between the pattern according to the plurality of sensor electrodes 120 and the body (fingertips) is detected and a touch state is determined.

FIG. 4B shows mutual capacitance type sensor electrodes 120. The mutual capacitance type is configured by a plurality of transmitter electrodes 124a (Tx electrodes) and a plurality of receiver electrodes 124b (Rx electrodes). Although the shapes of the transmitter electrodes 124a and the receiver electrodes 124b are arbitrary, the transmitter electrodes 124a and the receiver electrodes 124b are formed in a regular block pattern by a transparent conductive film so as to be difficult to see when arranged on the display screen side. For example, the transmitter electrodes 124a and the receiver electrodes 124b have a form in which a diamond electrode pattern is linked as is shown in FIG. 4B. Although the transmitter electrodes 124a and the receiver electrodes 124b are arranged so as to intersect, both are insulated. The transmitter electrodes 124a and the receiver electrodes 124b may be provided sandwiching the insulating layer, and may be provided in the same insulating surface. When the transmitter electrodes 124a and the receiver electrodes 124b are provided in the same insulating surface, one of the electrodes is connected by a bridge wiring 125. In a mutual capacitance type, pulse signals are applied to the transmitter electrodes 124a, and an electric field is formed between the receiver electrodes 124b. When the body (fingertips) gets close, the electric field is disturbed and the electric field detected by the receiver electrodes 124b is reduced, and electrostatic capacitance is also reduced. In the mutual capacitance type, this change in electrostatic capacitance is captured, and whether or not it is in a touch state is determined. By such a touch sensor 104, an input function is added to the display device.

In FIG. 3, the touch sensor 104 detects a change in electrostatic capacitance detected by the sensor electrodes 120 in the touch surface, and this may be used as sensing signals. However, the electric field should not be disturbed by electromagnetic noise on the touch surface of the touch sensor 104. In the display device with an input function 100 according to the present embodiment, the electromagnetic shield 106 is provided on the reverse surface side of the display panel 102, so it is possible to reduce the influence of electromagnetic noise generated in the functional circuit layer 112.

Figure 5:
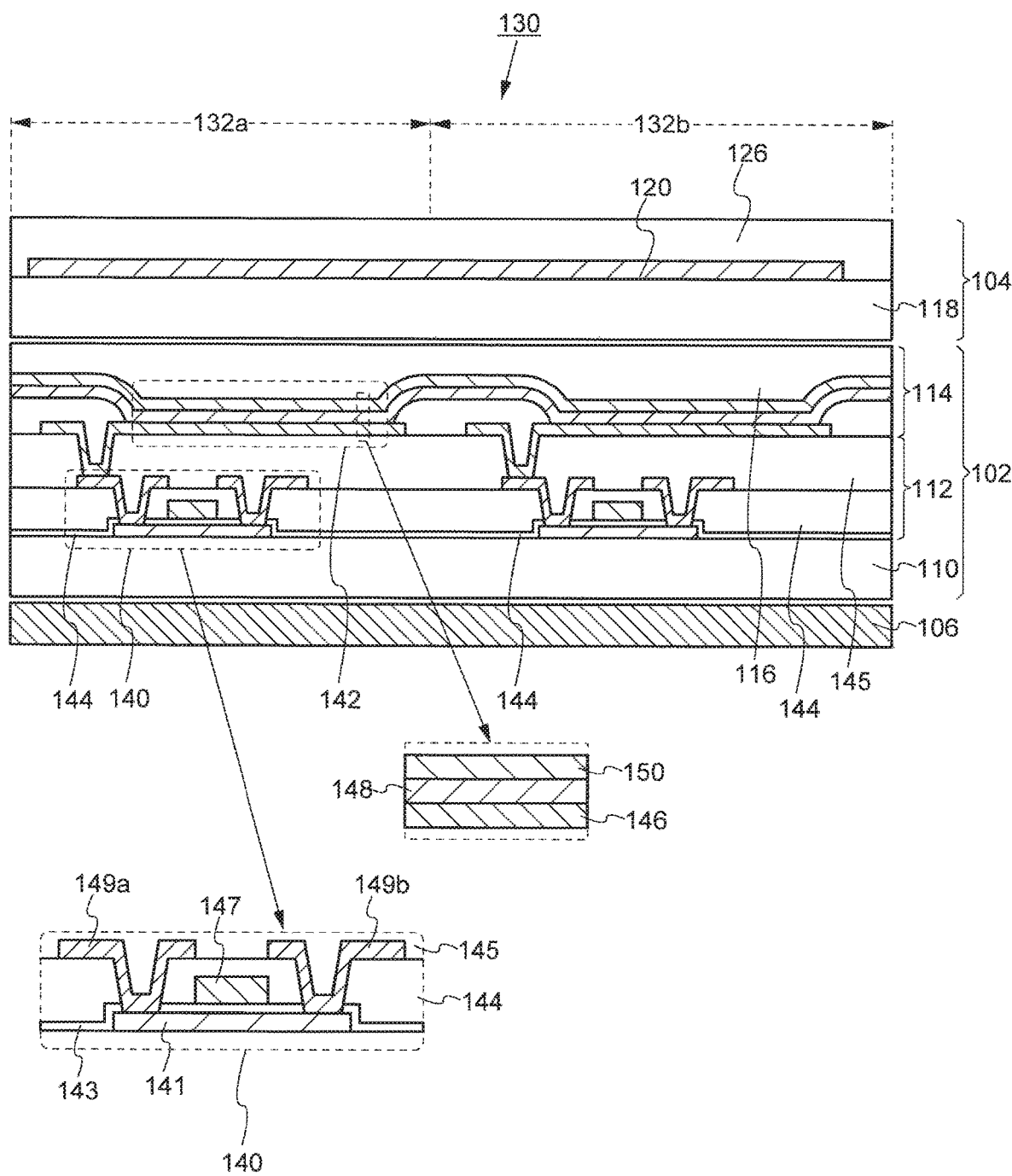
FIG. 5 is a cross-sectional view showing the structure of a pixel part of the display device with an input function according to an embodiment of the present invention.

FIG. 5 shows a cross-sectional structure of the pixel part 130, and a form in which the touch sensor 104 and the electromagnetic shield 106 are arranged overlapping the display panel 102. FIG. 5 shows a situation in which a first pixel 132a and a second pixel 132b are included as the structure of the pixel part 130. The display panel 102 is provided with a functional circuit layer 112 and a display element layer 114 on the first surface side of the substrate 110. The functional circuit layer 112 includes a transistor 140. The transistor 140 is embedded in the first insulating layer 144 and the second insulating layer 145 configuring a portion of the functional circuit layer 112.

The transistor 140 has a structure in which a semiconductor layer 141, a gate insulating layer 143, and a gate electrode 147 are stacked, as is shown in the inserted figure in FIG. 5. The semiconductor layer 141 is formed of amorphous or polycrystalline silicon, or oxide semiconductors and the like. Source/drain wirings 149a, 149b are provided above the gate electrode 147 via the first insulating layer 144. A second insulating layer 145 is provided as a planarizing layer above the source/drain wirings 149a, 149b. The first insulating layer 144 is formed of inorganic insulating materials such as silicon oxide, silicon nitride, and the like, and the second insulating layer 145 is formed of organic insulating materials such as polyimide, acrylic, and the like.

The display element layer 114 is arranged above the functional circuit layer 112. The display element layer 114 includes an organic EL element 142 as a display element. The organic EL element 142 has a structure in which a first electrode 146, an organic layer 148, and a second electrode 150 are stacked, as is shown in the inserted figure in FIG. 5. The organic EL element 142 is covered by the protection layer 116. In each of the first pixels 132a and the second pixels 132b, the organic EL elements 142 are electrically connected to the transistor 140. The transistor 140 controls the luminance of the organic EL element 142. The luminance of the organic EL element 142 is emitted through the protection layer 116.

The touch sensor 104 is arranged above the display element layer 114. The touch sensor 104 is provided with sensor electrodes 120 on the first surface of the substrate 118. The sensor electrodes 120 are formed of a transparent conductive film such as ITO (Indium Tin Oxide) and IZO (Indium Zinc Oxide). By forming the sensor electrodes 120 of a transparent conductive film, the display screen formed by the pixel part 130 may be visible through the touch sensor 104. The protection layer 126 may further be provided above the sensor electrodes 120.

The electromagnetic shield 106 is arranged on the surface on the opposite side to the side on which the touch sensor 104 is arranged with respect to the display panel 102. In other words, the electromagnetic shield 106 is arranged on the side of the second surface facing the first surface of the substrate 110. The electromagnetic shield 106 has conductive properties. It is possible to provide the electromagnetic shield in various forms. For example, a metallic film provided on the second surface of the substrate 110 may be used as the electromagnetic shield 106. Such a metallic film may be formed by stacking one layer or a plurality of layers of a metallic film such as aluminum, titanium, molybdenum, tungsten, chrome, and the like or a transparent conductive film such as ITO by a vapor deposition method and a sputtering method. A metallic thin film is provided adjacent to the substrate 110 of the display panel 102 so it may be rolled and folded with the display panel 102. As another form, a metallic film may be provided on one side of the substrate by an insulating film and the like, and this is arranged on the second surface side of the substrate 110 as the electromagnetic shield 106. Further, the electromagnetic shield 106 may be formed by providing a metallic foil on the second surface side of the substrate 110.

On the other hand, electromagnetic noise generated in the functional circuit layer 112 also radiates on the display element layer 114 side. However, the second electrodes 150 of the organic EL element 142 are arranged on substantially one side of the pixel part in the display element layer 114. Since the second electrodes 150 are maintained at a constant potential, they also function as the electromagnetic shield 106. A display element layer 114 including the organic EL element 142 is provided between the functional circuit layer 112 and the touch sensor 104, so one of the electrodes (second electrodes 150) of the organic EL element 142 may double as an electromagnetic shield.

Figure 6:
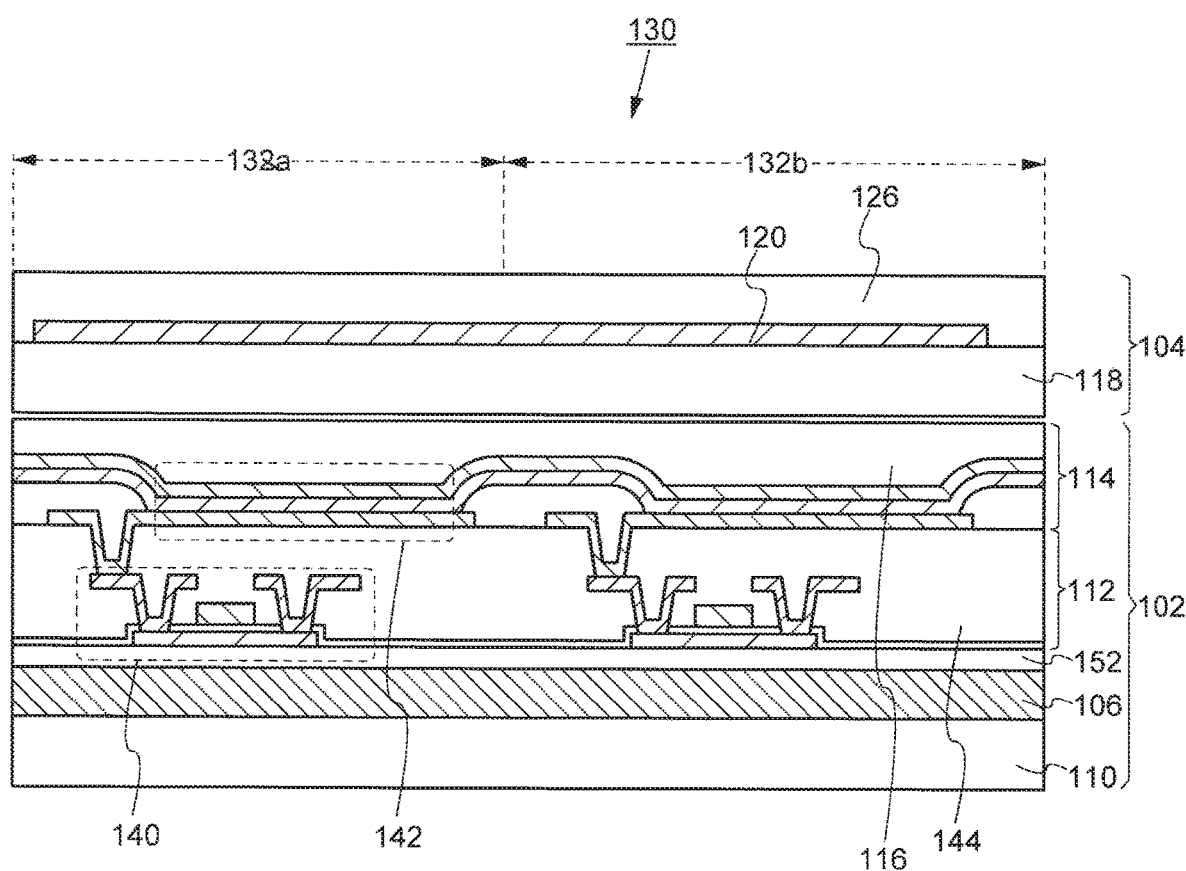
FIG. 6 is a cross-sectional view showing the structure of a pixel part of the display device with an input function according to an embodiment of the present invention.

As is shown in FIG. 6, the electromagnetic shield 106 may be provided between the substrate 110 and the functional circuit layer 112 with respect to the display panel 102. In this case, an insulating layer 152 may be provided between the electromagnetic shield 106 and the functional circuit layer 112. Each element and wiring included in the functional circuit layer 112 and the electromagnetic shield 106 may be insulated by the insulating layer 152. In this case, the electromagnetic shield 106 may be provided on the first surface of the substrate 110 by the metallic thin film and the like described above.

The substrate 110 of the display panel 102 may be formed of conductors. For example, aluminum foil and stainless steel thin plates and the like may be used as the substrate 110. In this case, similar to the case shown in FIG. 6, an insulating layer 152 is preferably provided on the surface of the functional circuit side of the substrate 110. In this form, the substrate 110 itself may be used as the electromagnetic shield.

The electromagnetic shield 106 is preferably provided so as to cover substantially the entire surface of the pixel part 130 and the drive circuit 134 of the display panel 102. The electromagnetic shield 106 preferably provides a fixed potential (for example, ground potential) or a potential which synchronizes with the operations of the touch sensor 104 and changes with a predetermined amplitude. By providing an electromagnetic shield in this way, electromagnetic noise generated in the functional circuit 112 may be securely shielded.

According to the present embodiment, as is shown in FIG. 5 and FIG. 6, a thin film or thin sheet or foil shaped electromagnetic shield 106 may be bent together with the display panel 102. That is to say, when the display device with an input function 100 is rolled and folded, the electromagnetic shield 106 may appear above the touch surface of the touch sensor 104. In this way, the functional circuit layer 112 formed including a transistor 140 is shielded by the electromagnetic shield 106, so the leak of electromagnetic noise is prevented and malfunction of the touch sensor 104 may be prevented.

Second Embodiment

Figure 7:
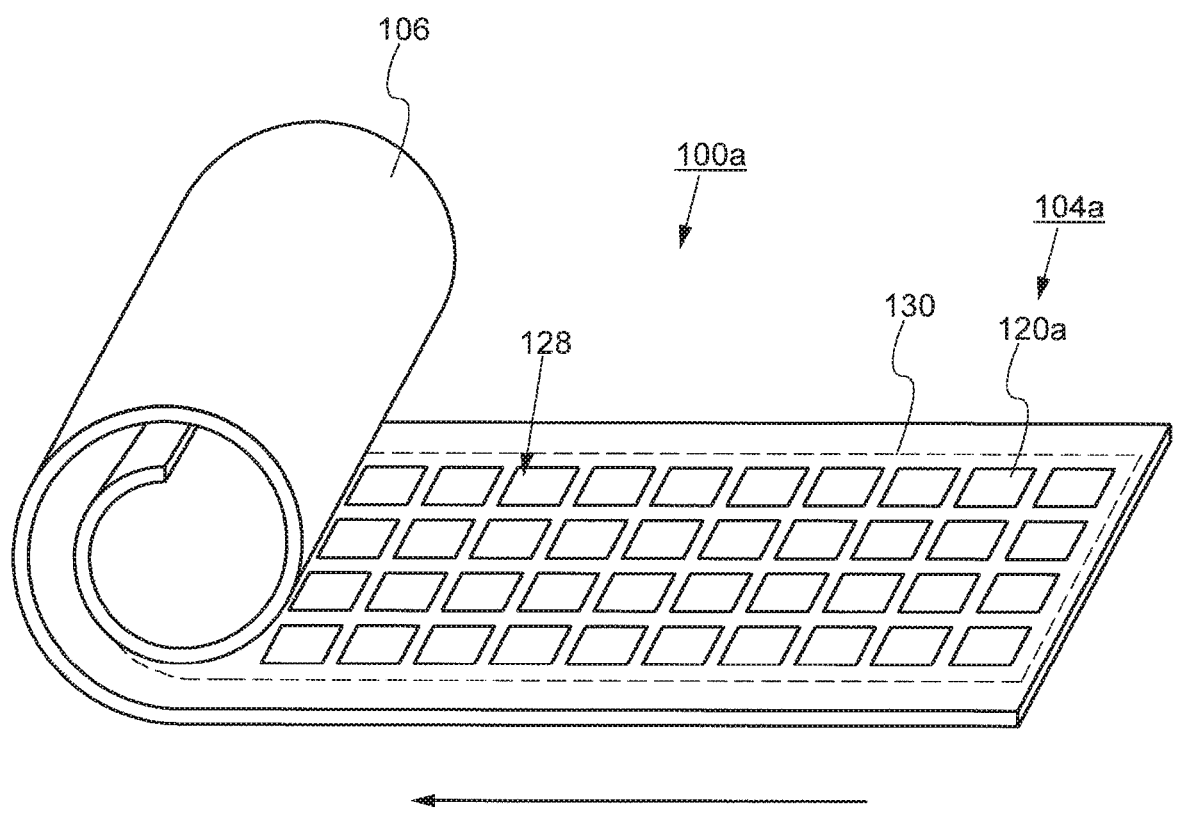
FIG. 7 is a diagram showing the structure of the display device with an input function according to an embodiment of the present invention.

FIG. 7 shows a situation in which the display device with an input function 100a provided with a self-capacitance type touch sensor 104a is curved and a portion of the pixel part 130 forming the display screen is rolled. Further, FIG. 7 shows the sensor electrodes 120a configuring the touch sensor 104a among the structural elements of the display device with an input function 100a.

The self-capacitance type touch sensor electrodes 120a have self-capacitance (for example, parasitic capacitance occurring between the second electrodes 150 of the organic EL elements 142). When the body (fingertips, etc.) gets close to the touch surface 128, electrostatic capacitance is generated between the sensor electrodes 120a and capacitance generated in the sensor electrodes 120a changes. The self-capacitance detection method detects the proximity of the body (fingertips, etc.) by measuring the change of electrostatic capacitance during non-touch and touch. A self-capacitance type has the benefit of a simple electrode structure.

The self-capacitance type touch sensors 104a are rolled up in the electromagnetic shield 106 and electrostatic capacitance does not occur in a state in which the sensor electrodes 120a are rolled. However, the rolled sensor electrodes 120a are distinguished and the operations of those sensor electrodes 120a are stopped, so malfunctions may be prevented.

Figure 8:
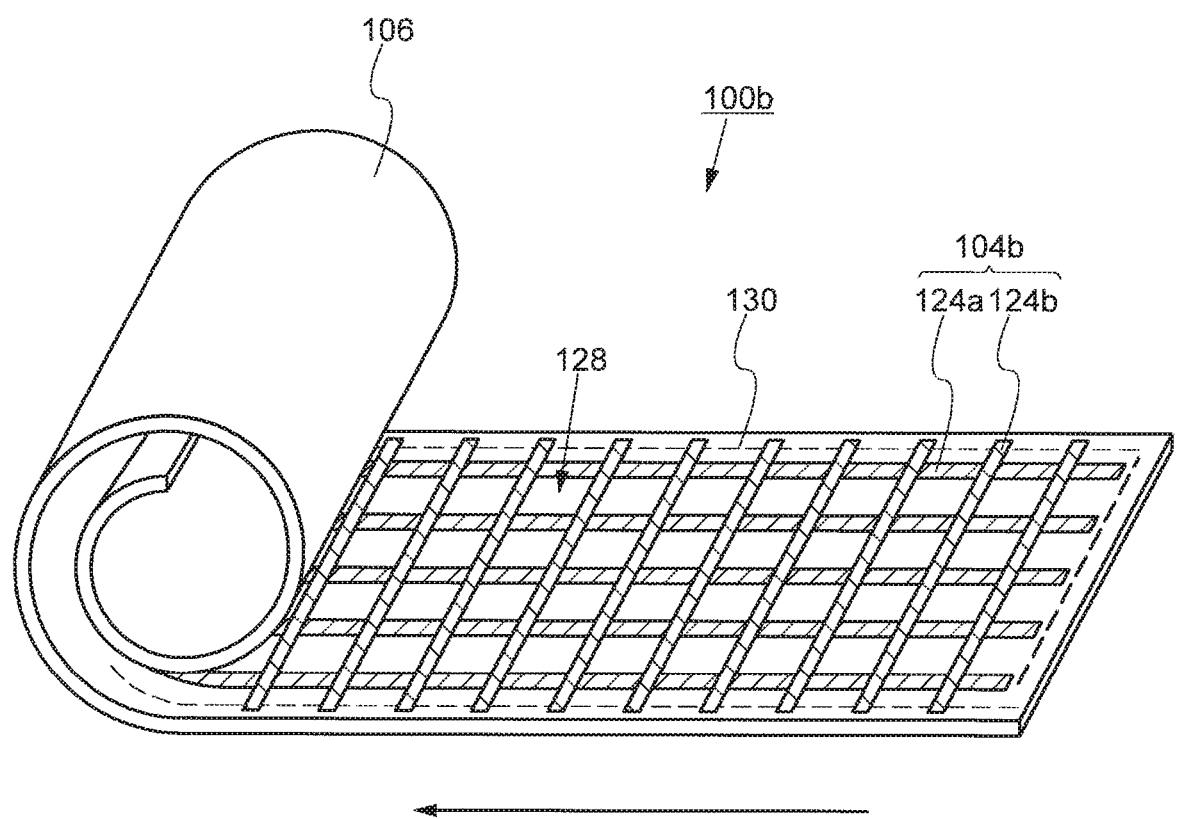
FIG. 8 is a diagram showing the structure of the display device with an input function according to an embodiment of the present invention.

FIG. 8 shows a situation in which the display device with an input function 100b provided with mutual capacitance type touch sensors 104b is curved and a portion of the pixel part 130 forming the display screen is rolled. FIG. 8 shows transmitter electrodes 124a (Tx electrodes) and receiver electrodes 124b (Rx electrodes) configuring a touch sensor 104b among the structural elements of the display device with an input function 100b. The transmitter electrodes 124a extend in a first direction and the receiver electrodes 124b extend in a second direction intersecting the first direction.

The mutual capacitance type, for example, maintains the receiver electrodes 124b at a constant potential (for example, ground potential), transmits a pulse signal from the transmitter electrode 124a side, and generates an electric field between both electrodes. When the body (fingertips) gets close to the touch surface 128 in this state, since a portion of the electric field is generated between the body and the transmitter electrodes 124a, the electric field between the transmitter electrodes 124a and the receiver electrodes 124b changes. Whether touch is there or not is detected by detecting the change of the electric field at that time (non-touch to touch). Each of the multiple transmitter electrodes 124a and the receiver electrodes 124b are arranged in a state forming a matrix (intersecting) on the display screen.

Based on such an operating principle, the transmitter electrodes 124a preferably extend in the direction in which the display device with an input function 100b is rolled (the direction shown by the arrow in FIG. 8). On the other hand, the receiver electrodes 124b are preferably arranged so as to extend in a direction intersecting the rolled direction. That is to say, the transmitter electrodes 124a are preferably arranged so that at least one portion is not rolled, even when rest of the transmitter electrodes 124a is rolled. Assuming that the transmitter electrodes 124a of the rolled region are arranged in a direction intersecting the rolled direction of the display screen, they are shielded by the electromagnetic shield 106, and signals for detecting a touch cannot be transmitted. On the other hand, when the transmitter electrodes 124a are arranged parallel to the rolled direction, the transmitter electrodes 124a of the region not rolled are in a state in which detection signals may be transmitted, so they may operate as normal. Further, when the entire display screen is rolled, the touch sensor 104b is similarly rolled, so the operations of the transmitter electrodes 124a may be stopped.

On the other hand, the rolled region of the receiver electrodes 124b are blocked by the electromagnetic shield 106 from the electric field generated by the transmitter electrodes 124a. As a result, the output from the rolled receiver electrodes 124b shows the same value no matter which transmitter electrode 124a is operated. At this time, it may be determined that the receiver electrodes 124b showing the same value are rolled and the operation for the rolled receiver electrodes 124b is stopped.

Figure 9:
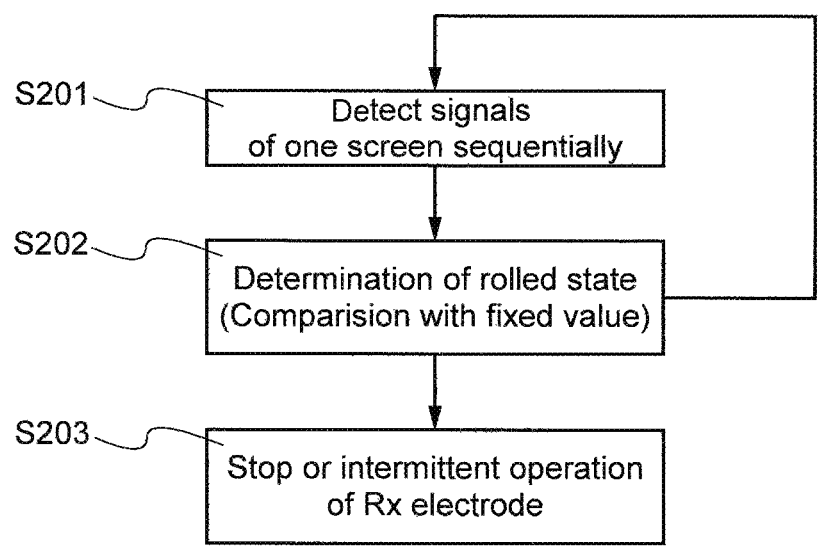
FIG. 9 is a flow chart explaining the operation of the display device with an input function according to an embodiment of the present invention.

FIG. 9 shows a flowchart describing the operations for determining the rolled state in the display device with an input function 100b provided with a mutual capacitance type touch sensor 104b. First, the first sensor electrodes (Tx electrodes) and the second sensor electrodes (Rx electrodes) are sequentially scanned and signals of one screen are detected (S201). Following this, the rolled state is determined (S202). The determination of the rolled state is performed sequentially from the Rx electrodes close to the rolled axis. For example, the determination standards below may be applied to all of the data (data of a few minutes of all of the intersecting first sensor electrodes (Tx electrodes)) provided by second sensor electrodes (Rx electrodes).

(1) When all of the data is within a predetermined range (for example within ±10%)

(2) When all of the data is within a previously determined fixed value range (for example, the fixed value is applied as a measured value provided by the output of the previous rolled state).

(3) When the Rx electrodes closer to the rolled axis also determine the rolled state.

Whether or not the second sensor electrodes (Rx electrodes) are in a rolled state is determined by whether or not one or several of the conditions (preferably all conditions) (1) through (3) are fulfilled. In this way, according to the present embodiment, the rolled state of the display screen may be determined by electrodes configuring the touch sensor 104b, so sensors detecting a newly rolled state may be not provided.

In FIG. 9, as a result of determination (S202), the Rx electrodes determined to be in a rolled state may stop operations or transition to intermittent operations (S203). In this way, malfunctions of the touch sensor 104b may be securely prevented and power consumption may be reduced.

As is shown in FIG. 8, even in a state in which a portion of the display device with an input function 100b is rolled, the influence of electromagnetic noise from the functional circuit layer is reduced because the electromagnetic shield 106 appears to on the touch surface 128. The transmitter electrodes 124a are arranged in a direction parallel to the rolled direction, so even in a state in which a portion of the display screen is rolled, the touch sensor 104b may be operated normally.

According to the present embodiment, when the display panel with an input function is rolled, it is configured so that the electromagnetic shield appears on the touch surface of the touch sensor, so malfunctions and reduction of sensitivity of the touch sensor may be prevented.

Third Embodiment

Figure 10:
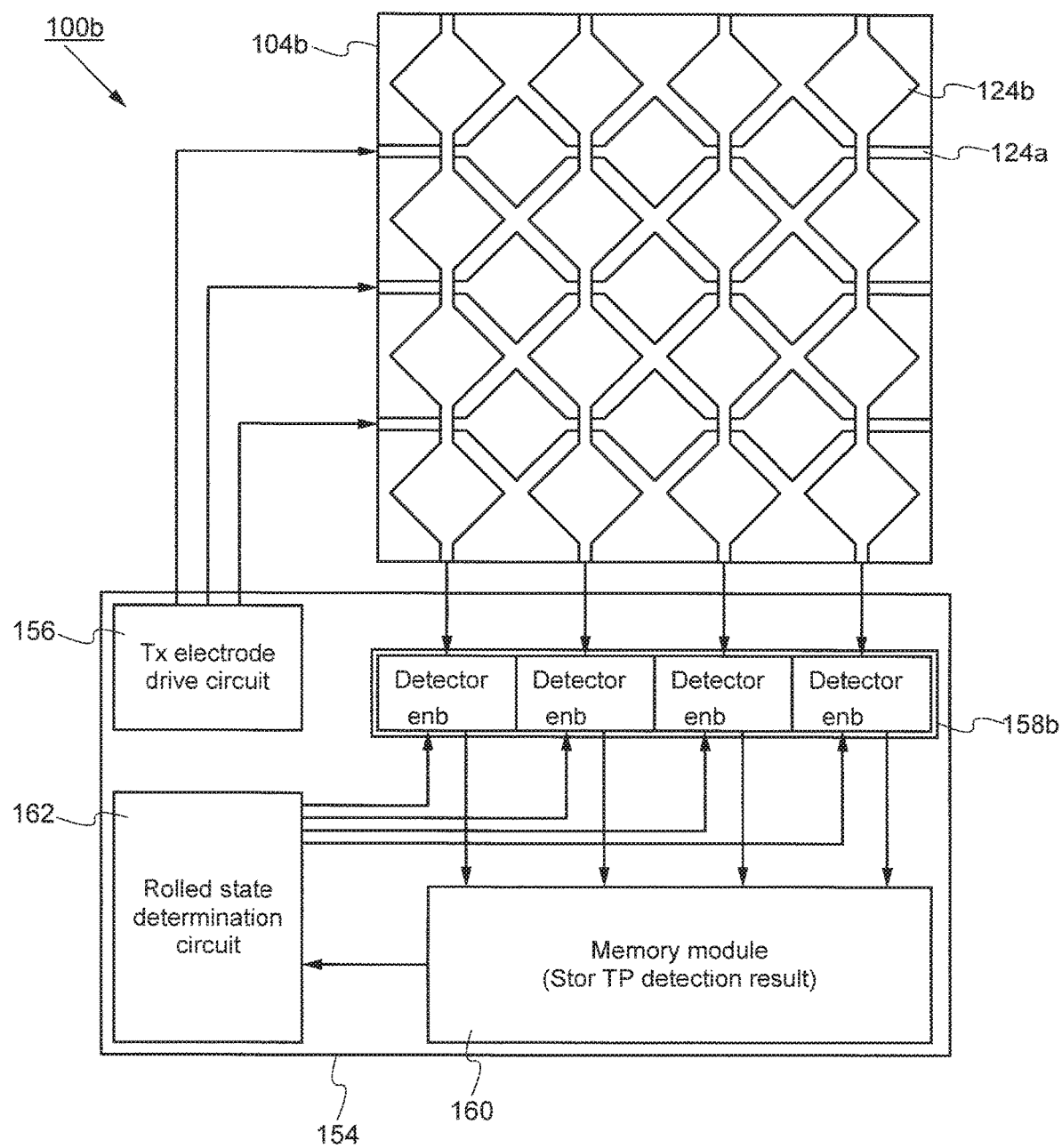
FIG. 10 is a diagram showing the structure of the display device with an input function according to an embodiment of the present invention.

FIG. 10 shows the structure of the display device with an input function 100*b* provided with a mutual type touch sensor in a functional block diagram. FIG. 10 shows a control circuit 154*b* including a touch sensor 104*b* provided with first sensor electrodes (Tx electrodes) 124*a* and second sensor electrodes (Rx electrodes) 124*b*, detectors 158*b*, a Tx electrode drive circuit 156, a memory module 160, and a rolled determination circuit 162 as the structure of the display device with an input function 100*b*. The detectors 158*b* are realized by a microcomputer including a detection circuit and a CPU configured by a resistor element, a condenser element, an operational amplifier, and the like. The rolled determination circuit 162 is realized by a microcomputer and the like including memory and a CPU. The memory module 160 is configured by storage elements such as dynamic memory, static memory, or non-volatile memory. The Tx electrode drive circuit 156 is configured by circuits such as a pulse generating circuit, an amplifier, a shift resister, and the like.

The Tx electrode drive circuit 156 outputs pulse signals to a plurality of transmitter electrodes 124*a*. The detectors 158*b* facing each of the plurality of receiver electrodes 124*b* detect a change in electrostatic capacitance formed by the transmitter electrodes 124*a* and the receiver electrodes 124*b* as voltage signals. The measurement value detected by each of the receiver electrodes 124*b* is stored in the memory module 160 as data for one screen. The rolled determination circuit 162 reads the measurement data for one screen from the memory module 160 and determines the rolled state. The rolled determination circuit 162 executes the same determination process as in the second embodiment and determines the rolled state. As a result of the determination, when it is determined that a portion of the display screen is in a rolled state, signals stopping the operation of the receiver electrodes 124 of the corresponding region or signals thinning out the drive force intervals are output to the detectors 158*b*. In this way, the receiver electrodes 124*b* in a state in which the display screen is rolled are distinguished, and the operation detecting the touch state is stopped, so malfunction of the touch sensor is prevented, and power consumption may be reduced.

Figure 11:
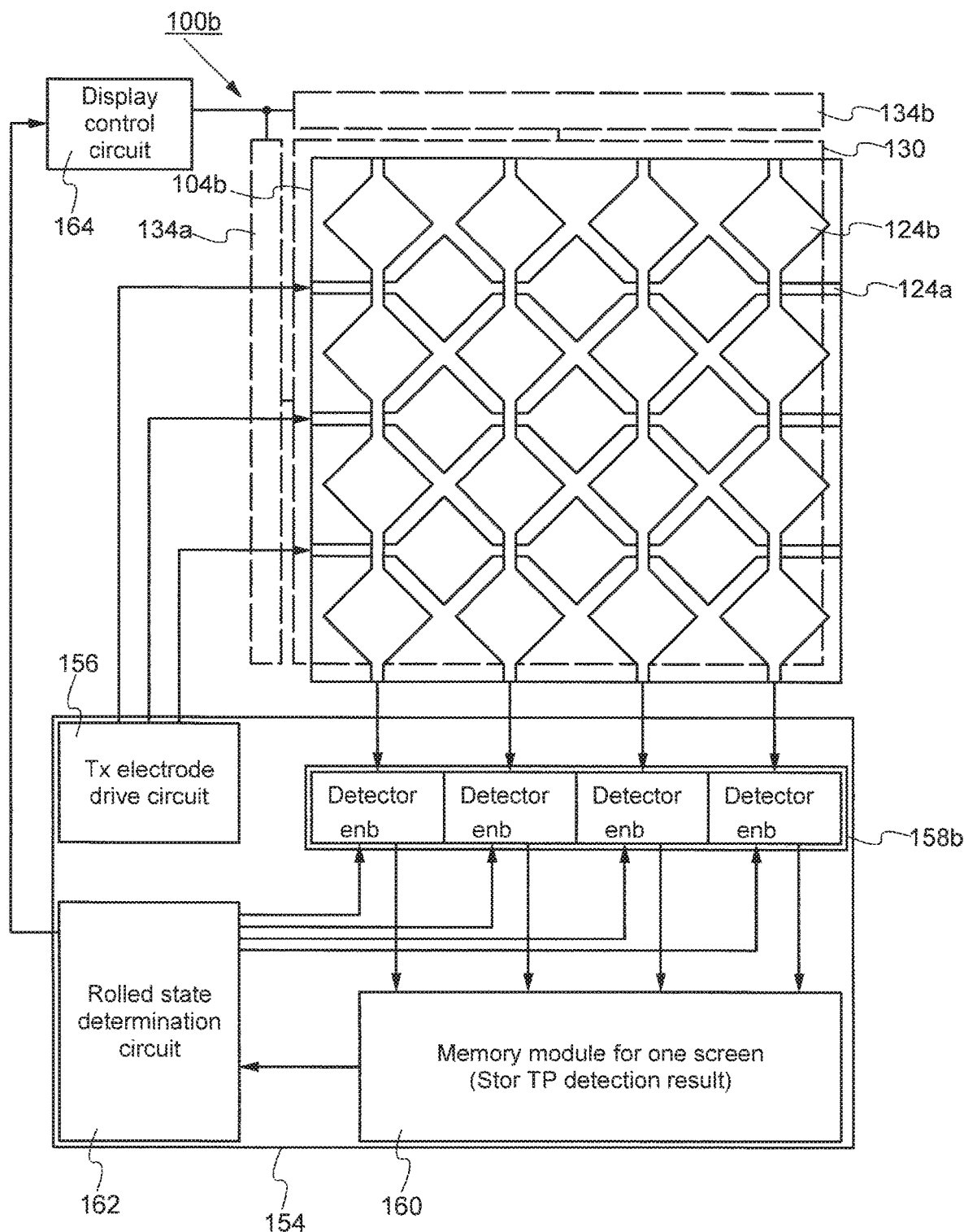
FIG. 11 is a diagram showing the structure of the display device with an input function according to an embodiment of the present invention.

The transmitter electrodes 124*a* and the receiver electrodes 124*b* configuring the touch sensor 104*b* are arranged so as to form a matrix in the display screen. Therefore, by determining the address of the receiver electrodes 124*b* in a rolled state, the region of the display screen which is rolled to may be determined. At this time, as is shown in FIG. 11, the rolled state determination circuit 162 may output the information of the rolled location to the display control circuit 164. The display control circuit 3 outputs signals stopping the screen display of the rolled region to the first drive circuit 134*a* outputting scanning signals and the second drive circuit 134*b* outputting image signals. Since images are not visible in the region in which the display screen is rolled, display operations in this region stop, so a low power consumption display device may be achieved.

Fourth Embodiment

Figure 12:
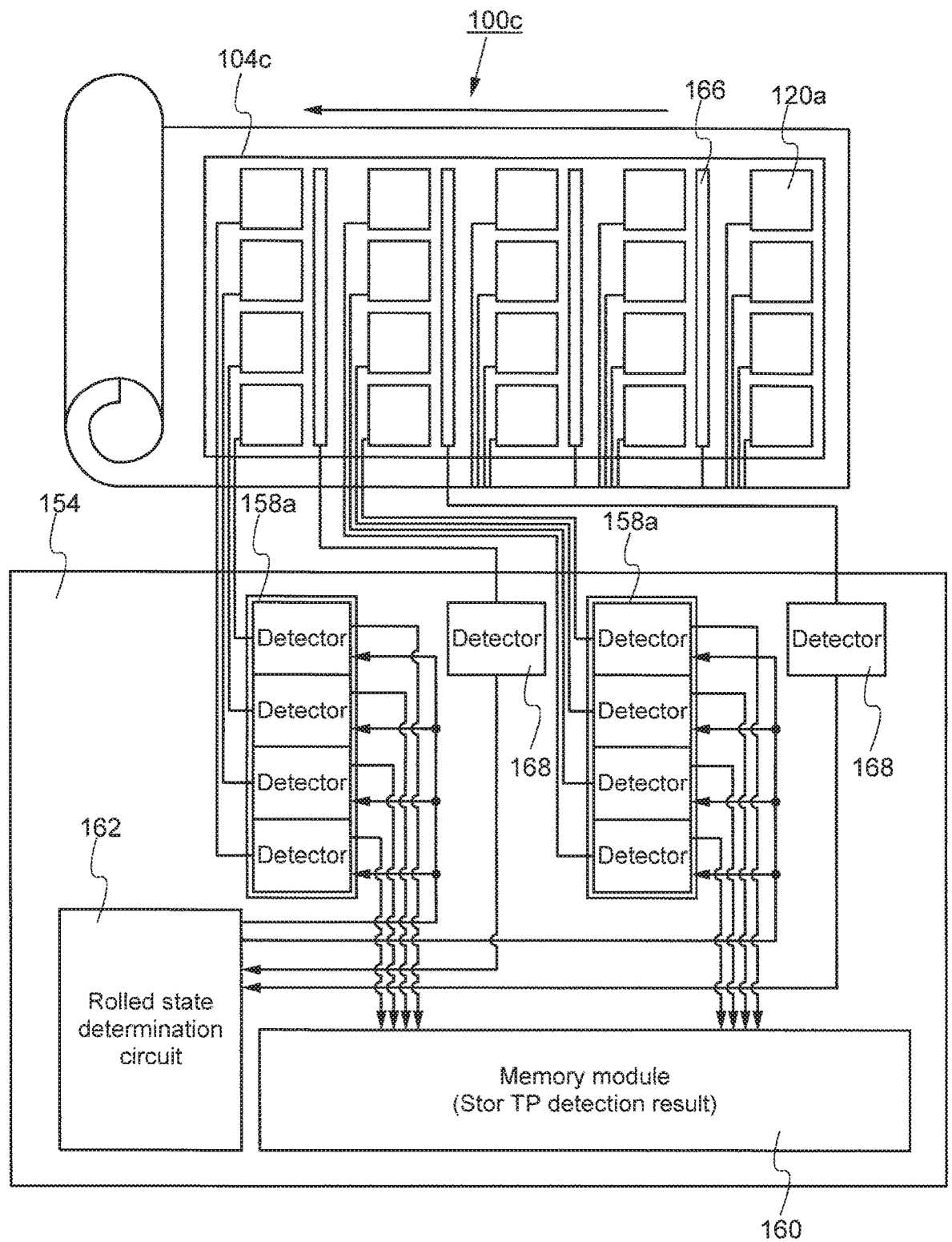
FIG. 12 is a diagram showing the structure of the display device with an input function according to an embodiment of the present invention.

FIG. 12 is a functional block diagram showing the structure of the display device with an input function 100*c* provided with a self-capacitance type touch sensor. A plurality of sensor electrodes 120*a* are arranged as a touch sensor 104*c*. Rolled detection electrodes 166 are provided in the plurality of sensor electrodes 120*a* arranged in a matrix. For example, in FIG. 12, the way to roll the display screen (the direction of the arrow shown in the diagram) is in a row direction, and a column direction intersecting the row direction. The rolled detection electrodes 166 are arranged at predetermined intervals along the row direction. For example, the rolled detection electrodes 166 are arranged between each column of the sensor electrodes 120*a*. The arrangement of the rolled detection electrodes 166 is arbitrary, and they may be arranged in each column of the plurality of sensor electrodes 120*a*. By narrowing the intervals at which the rolled state detection electrodes 166 are arranged, the detection accuracy of the rolled state of the display screen improves accordingly.

The sensor electrodes 120*a* are connected to the detectors 158*a*. In normal operations, the detectors 158*b* measure the potential of the sensor electrodes 120*a*. The measurement value measured by the detectors 158*a* is output to the memory module 160. The rolled detection electrodes 166 are connected to rolled detectors 168. When the rolled state is determined, the rolled detection electrodes 166 operate as receiver electrodes (Rx electrodes). On the other hand, the sensor electrodes 120*a* adjacent to the rolled detection electrodes 166 operate as transmitter electrodes (Tx electrodes). For example, one row of sensor electrodes 120*a* adjacent to rolled detection electrodes 166 operate as transmitter electrodes.

In the operation mode for detecting the rolled state, pulse signals output from the sensor electrodes 120*a* are transmitted to the rolled detection electrodes 166, and the measurement values measured by the rolled detectors 168 are output to the rolled state determination circuit 162. The rolled state determination circuit 162 may perform the same determination of the rolled state as in the second embodiment. As is shown in FIG. 11, depending on the determination results of the rolled state determination circuit 162, image display may be stopped in the regions in which the display screen is rolled.

In the display device with an input function 100*c* according to the present embodiment, in the operation detecting whether or not there is a touch, the sensor electrodes 120*a* operating as self-capacitance types detect a change in electrostatic capacitance. In the present embodiment, the electromagnetic shield also appears on the touch surface in a state in which the display screen is rolled, so whether or not the screen is being touched may be detected without being influenced by electromagnetic noise. On the other hand, when detecting the rolled state, the sensor electrodes 120*a* operate as transmitter electrodes, and the rolled state detection electrodes 166 operate as receiver electrodes, so the rolled state of the display screen may be detected.

Fifth Embodiment

Figure 13:
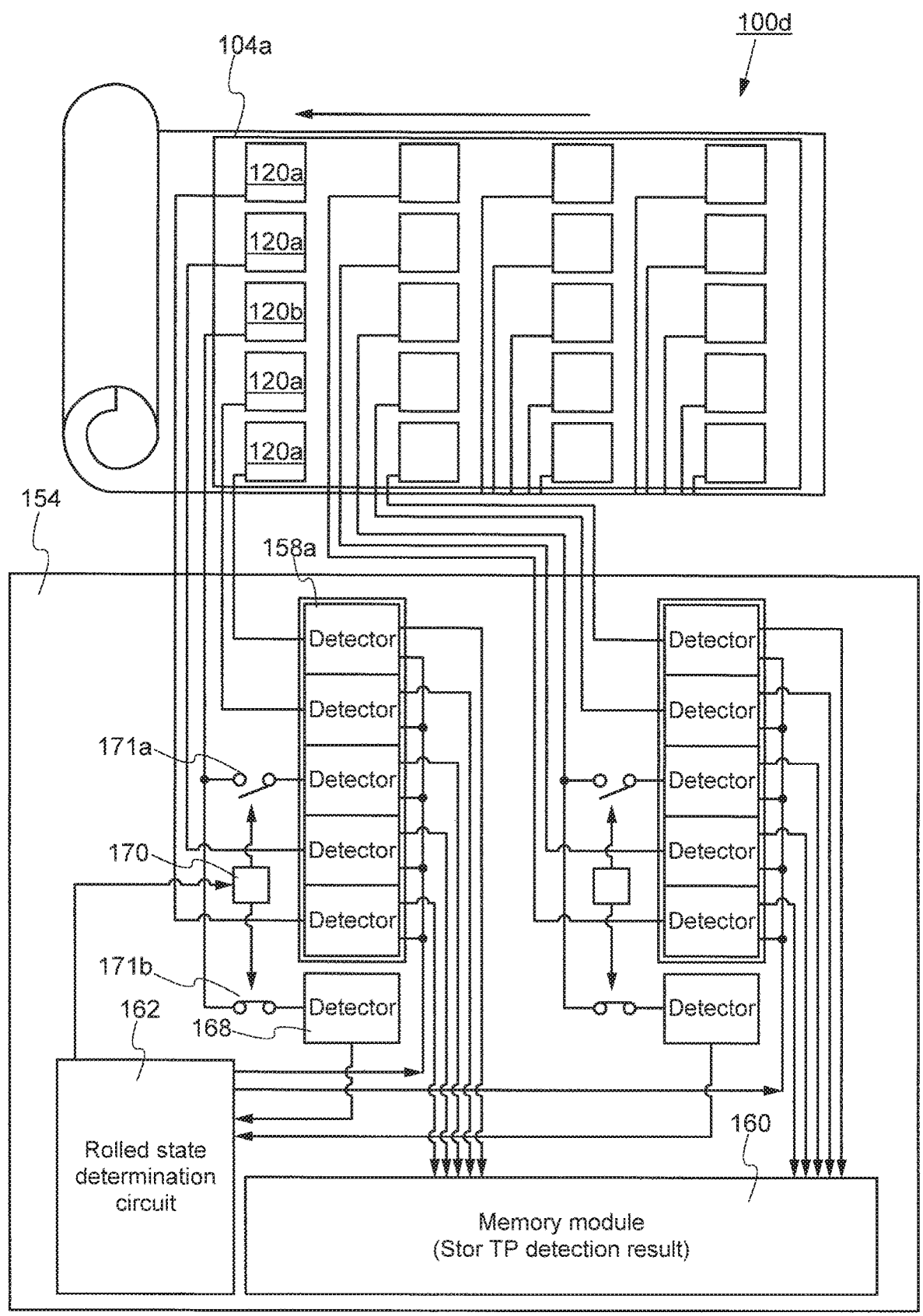
FIG. 13 is a diagram showing the structure of the display device with an input function according to an embodiment of the present invention.

FIG. 13 is a functional block diagram showing the structure of the display device with an input function 100*d* provided with a self-capacitance type touch sensor 104*a*. A plurality of first sensor electrodes 120*a* and second sensor electrodes 120*b* are arranged as the touch sensor 104*a*. The second sensor electrodes 120*b* are arranged scattered among the first sensor electrodes 120*a*. For example, one second sensor electrode 120*b* is arranged in an array (a one-column array) of first sensor electrodes 120*a* in the column direction.

The first sensor electrodes 120*a* and the second sensor electrodes 120*b* are connected to each of the detectors 158*a*.

Further, the access point for the second sensor electrodes 120b and one of the detectors 158a or the rolled detectors 168 may be switched by the selection switches 171a, 171b. The operations of the selection switches 171a, 171b are controlled by the switch control circuit 170 so that when one selection switch is on, the other selection switch is off. When the first sensor electrodes 120a and the second sensor electrodes 120b detect whether or not there is a touch on the screen, the sensor switch 171a is on and the selection switch 171b is off, and operate connected to the detectors 158a. On the other hand, when the rolled state is determined, the selection switch 171a is off and the selection switch 171b is on, and the second sensor electrodes 120b are connected to the rolled detectors 168. At this time, at least one of the first sensor electrodes 120a operates as a transmitter electrode, and the second sensor electrodes 120b operate as receiver electrodes. Such operations, depending on the rolled state determination circuit 162, are realized by controlling the switch control circuit 170 and the detectors 158a.

During rolled state detection, the measurement results of the rolled detectors 168 connected to the second sensor electrodes 120b are output to the rolled state determination circuit 162. The rolled state determination circuit 162, similar to that of the second embodiment, determines the rolled state.

According to the present embodiment, a portion of the electrodes detecting self-capacitance operate as transmitter electrodes and receiver electrodes, so even without adding new electrodes, the rolled state of the display screen may be dynamically detected. In this way, the first sensor electrodes 120a and the second sensor electrodes 120b in a state in which the display screen is rolled are distinguished, and operations detecting the touch state are stopped, so malfunctions of the touch sensor may be prevented and power consumption may be reduced. Further, as in the third embodiment, the rolled state determination circuit 162 may stop the screen display of the relevant regions based on the information of the rolled location. Since images are not visible in the region in which the display screen is rolled, the display operations of this region are stopped, so a display device with lower power consumption may be achieved.

Sixth Embodiment

Figure 14:
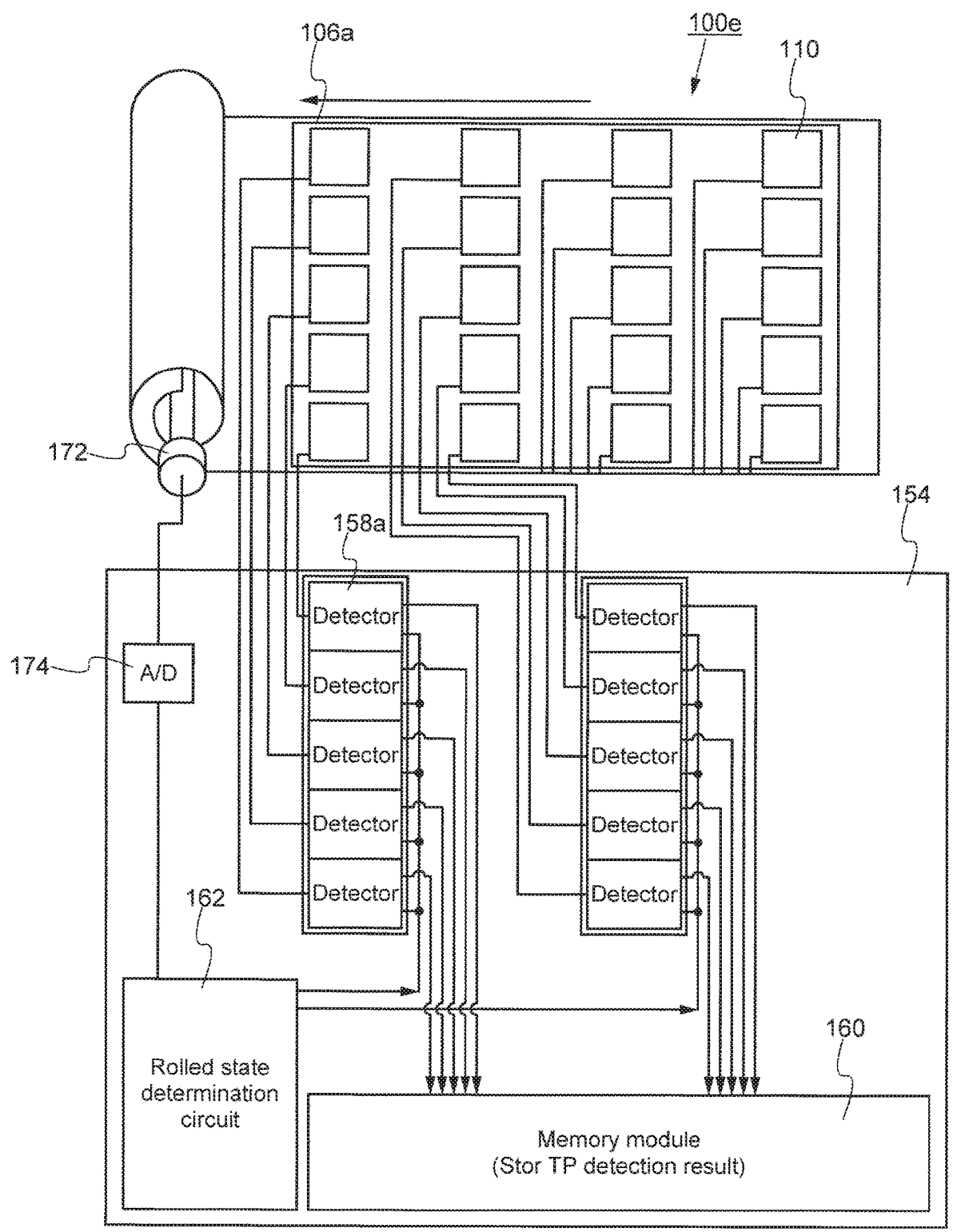
FIG. 14 is a diagram showing the structure of the display device with an input function according to an embodiment of the present invention.

FIG. 14 shows an example in which a rotation sensor 172 for detecting the rolled amount is provided on the rotation axis of the rolled display screen in the display device with an input function 100e having flexibility. A multi-rotation volume resistance, for example, may be used as the rotation sensor 172 detecting the rolled amount. The structure of the touch sensor 104a is similar to that of the fifth embodiment in that an A/D conversion circuit 174 into which the output of the rotation sensor 172 is input is provided in the control circuit 154, but differs in that the output of the A/D conversion circuit 174 is input into the rolled state determination circuit 162. The structure of the detectors 158b, the memory module 160, and the rolled state determination circuit 162 are the same as that of the fifth embodiment.

The output of the rotation sensor 172 is input into the rolled state determination circuit 162 via the A/D conversion circuit 174. The rolled state determination circuit 162 determines the rolled state in the same way as in the second embodiment. The determination of the rolled state references the table in which the interaction of the previously set rotation number and resistance value are recorded, and determines to which region the display screen is rolled. The rolled state determination circuit 162 outputs signals stopping the operation of the detectors 158a corresponding to the rolled region. For example, the rolled state determination circuit 162 controls the enable signal of the self-capacitance detectors 158 and controls the termination of operations of the detectors 158a.

Further, although the present embodiment shows a situation in which self-capacitance type electrodes are arranged as the touch sensor 104a, a mutual capacitance type touch sensor 104b as shown in the second embodiment may be applied.

In this way, according to the present embodiment, sensors detecting the rotation amount are used, so the rolled state of the display screen is detected and the operations of the touch sensor 104 may be controlled. In this way, the sensor electrodes 120 in a state in which the display screen is rolled are distinguished, and operations detecting the touch state are stopped, so malfunctions of the touch sensor may be prevented and power consumption may be reduced. Further, similar to the third embodiment, the rolled state determination circuit 162 may stop the screen display of the relevant regions based on the information of the rolled position. Since images are not visible in the regions in which the display screen is rolled, the display operations of these regions are stopped, so a display device with reduced power consumption may be achieved.

What is claimed is:

1. A display device with an input function comprising:
   a display panel having flexibility to be rolled in a first direction, the display panel including a pixel region;
   a touch sensor on the display panel to be rolled with the display panel in the first direction, the touch sensor including a plurality of first sensor electrodes and a second sensor electrode in a region overlapping at least the pixel region; and
   a control circuit connected to the touch sensor, the control circuit including:
      a plurality of detection circuits each of which is electrically connected to one of the first sensor electrodes and the second sensor electrode,
      a rolled detector,
      a rolled state determination circuit for detecting the rolled state of the display panel,
      a first switch provided between the second sensor electrode and one of the plurality of detection circuits, and
      a second switch provided between the second sensor electrode and the rolled detector,
   wherein the first switch turns on when the second switch turns off and the second switch turns on when the first switch turns off based on a signal from the rolled state determination circuit,
   wherein when the first switch turns off and the second switch turns on, the second sensor electrodes function as a receiver electrode and at least one of the first sensor electrodes function as transmitter, and
   wherein the control circuit stops the signal detection of at least the first sensor electrodes included in the rolled region based on the signal of the rolled state determination circuit when the display panel is rolled.

2. The display device with an input function according to claim 1,
   wherein when the first switch turns on and the second switch turns off, the plurality of first sensor electrodes and the plurality of second sensor electrodes function as self-capacitance type sensors.

3. The display device with an input function according to claim 1, wherein the pixel region includes a plurality of pixels,
the plurality of pixels includes a plurality of pixel electrodes, a second electrode, and an organic layer,
each of the plurality of pixel electrodes is arranged corresponding to each of the plurality of pixels,
the second electrode is arranged to face the plurality of first electrodes, and is provided over substantially the entire pixel region, and
the organic layer includes organic electroluminescence materials, and is arranged between the plurality of pixel electrodes and the second electrode.

4. The display device with an input function according to claim 3,
wherein the display panel includes at least one transistor electrically connected to the first electrode in each of the plurality of pixels.

5. The display device with an input function according to claim 1,
wherein the first sensor electrodes and the second sensor electrode are arranged in a second direction crossing the first direction.

6. The display device with an input function according to claim 5,
wherein the second sensor electrode is located at the center of the touch sensor in the second direction.

7. The display device with an input function according to claim 5,
wherein a set of the plurality of first sensor electrodes and the plurality of second sensor electrodes comprises a plurality of sets, the plurality of sets are arranged in the first direction.

8. The display device with an input function according to claim 5,
wherein the touch sensor includes a plurality of sets of the plurality of first sensor electrodes and the plurality of second sensor electrodes, the plurality of sets of the plurality of first sensor electrodes and the plurality of second sensor electrodes are adjacent to side by side in the first direction.

9. A display device with an input function comprising:
a display panel having flexibility to be rolled in a first direction, the display panel including a pixel region;
a touch sensor on the display panel to be rolled with the display panel in the first direction, the touch sensor including a plurality of first sensor electrodes and a second sensor electrode in a region overlapping at least the pixel region; and
a control circuit connected to the touch sensor, the control circuit including:
a plurality of detection circuits each of which is electrically connected to one of the first sensor electrodes and the second sensor electrode,
a rolled detector,
a rolled state determination circuit for detecting the rolled state of the display panel,
a first switch provided between the second sensor electrode and one of the plurality of detection circuits, and
a second switch provided between the second sensor electrode and the rolled detector, and
an electromagnetic shield arranged overlapping the display panel,
wherein the first switch turns on when the second switch turns off and the second switch turns on when the first switch turns off based on a signal from the rolled state determination circuit,
wherein the display panel is sandwiched by the touch sensor and the electromagnetic shield, and
the touch sensor and the electromagnetic shield are to be rolled together with the display panel.

10. The display device with an input function according to claim 9,
wherein when the first switch turns on and the second switch turns off, the plurality of first sensor electrodes and the plurality of second sensor electrodes function as self-capacitance type sensors.

11. The display device with an input function according to claim 9,
wherein when the first switch turns off and the second switch turns on, the second sensor electrodes function as a receiver electrode and at least one of the first sensor electrodes function as transmitter.

12. The display device with an input function according to claim 11,
wherein the control circuit stops the signal detection of at least the first sensor electrodes included in the rolled region based on the signal of the rolled state determination circuit when the display panel is rolled.

13. The display device with an input function according to claim 9,
wherein the pixel region includes a plurality of pixels,
the plurality of pixels includes a plurality of pixel electrodes, a second electrode, and an organic layer,
each of the plurality of pixel electrodes is arranged corresponding to each of the plurality of pixels,
the second electrode is arranged to face the plurality of first electrodes, and is provided over substantially the entire pixel region, and
the organic layer includes organic electroluminescence materials, and is arranged between the plurality of pixel electrodes and the second electrode.

14. The display device with an input function according to claim 13,
wherein the display panel includes at least one transistor electrically connected to the first electrode in each of the plurality of pixels.

15. The display device with an input function according to claim 9,
wherein the first sensor electrodes and the second sensor electrode are arranged in a second direction crossing the first direction.

16. The display device with an input function according to claim 15,
wherein the second sensor electrode is located at the center of the touch sensor in the second direction.

17. The display device with an input function according to claim 15,
wherein a set of the plurality of first sensor electrodes and the plurality of second sensor electrodes comprises a plurality of sets, the plurality of sets is arranged in the first direction.

18. The display device with an input function according to claim 15,
wherein the touch sensor includes a plurality of sets of the plurality of first sensor electrodes and the plurality of second sensor electrodes, the plurality of sets of the plurality of first sensor electrodes and the plurality of second sensor electrodes are adjacent to side by side in the first direction.

* * * * *